United States Patent [19]

Kawabata

[11] Patent Number: 5,296,820

[45] Date of Patent: Mar. 22, 1994

[54] COHERENT DEMODULATOR PRECEDED BY NON-COHERENT DEMODULATOR AND AUTOMATIC FREQUENCY CONTROL CIRCUIT

[75] Inventor: Hisashi Kawabata, Tokyo, Japan

[73] Assignee: NEC Corporation, Tokyo, Japan

[21] Appl. No.: 935,853

[22] Filed: Aug. 26, 1992

[30] Foreign Application Priority Data

Aug. 28, 1991 [JP] Japan .................................. 3-216777

[51] Int. Cl.$^5$ ............................................. H04L 27/22
[52] U.S. Cl. .................................. 329/307; 329/308; 329/325; 329/346; 375/81
[58] Field of Search ......................... 329/302, 306–309, 329/323, 326, 346, 358, 360; 375/80, 81, 120; 455/260, 265

[56] References Cited

U.S. PATENT DOCUMENTS 3,371,281 2/1968 Powell ............................ 329/325 X
5,128,626 7/1992 Iwasaki ................................ 329/307

Primary Examiner—Siegfried H. Grimm
Attorney, Agent, or Firm—Laff, Whitesel, Conte & Saret

[57] ABSTRACT

A non-coherent demodulator 1 multiplies a modulated intermediate frequency (IF) signal with a signal from a local oscillator 2 to produce a first pseudo baseband signal having frequency error. The first pseudo baseband signal is supplied to a wide band PLL type demodulator 15. A low-pass filter 26 removes noise component from a first control signal from a loop filter 19 in the wide band PLL type demodulator 15 to produce a second control signal. Multipliers 24 and 25 multiply the first pseudo baseband signal with an output of a voltage-controlled oscillator 27 controlled by the second control signal to produce a second pseudo baseband signal having smaller frequency error. The second pseudo baseband signal is supplied to a narrow band demodulator 14 and converted into a baseband signal.

10 Claims, 3 Drawing Sheets

COHERENT DEMODULATOR PRECEDED BY NON-COHERENT DEMODULATOR AND AUTOMATIC FREQUENCY CONTROL CIRCUIT

BACKGROUND OF THE INVENTION

The present invention relates to a demodulating device and, particularly, to a demodulating device for demodulating a signal whose carrier frequency variation is considerable.

In order to demodulate an input signal such as an intermediate frequency (IF) signal or any other modulated signal to produce a baseband signal, a demodulating device composed of a non-coherent demodulator, a coherent demodulator and a phase-locked loop (PLL) type carrier reproduction circuit has been known. In such conventional demodulating device, the non-coherent demodulator multiplies a modulated IF signal with a local oscillation frequency signal whose frequency is close to that of the modulated IF signal to produce a complex baseband signal containing frequency error. Then, the complex baseband signal is multiplied with a reproduced carrier signal in the coherent demodulator to produce a baseband signal. The carrier is reproduced by using PLL type carrier reproduction circuit. The carrier reproduction circuit serves to synchronize an oscillation frequency of a voltage controlled oscillator with the frequency error components of the baseband signal. An example of such PLL type carrier reproduction circuit is described in pages 222-225 of a book entitled "Phase-lock Techniques" by Floyd M. Gardner, Ph.D and published John Wiley & sons, Inc., reprinted 1979.

When such demodulating device is used to demodulate a modulated signal such as used in mobile communication system in which carrier frequency may vary considerably, the frequency variation may go out of a pull-in range of the PLL carrier reproduction circuit, so that a reproduced carrier may frequently slip out, making it impossible to receive the modulated signal. On the other hand, when, in order to make the pull-in range wider to solve this problem, a loop noise bandwidth of a loop filter provided inherently within the PLL type carrier reproduction circuit is expanded, noise becomes considerable, causing insensitivity of the demodulating device to noise to be degraded.

SUMMARY OF THE INVENTION

Therefore, an object of the present invention is to provide a demodulating device which can be used for a signal whose carrier frequency variation is very large.

Another object of the present invention is to provide a demodulating device which can demodulate a signal having large frequency variation while maintaining its insensitivity to noise.

In order to achieve the above-mentioned objects, a demodulating device according to the present invention comprises a non-coherent demodulator for multiplying a modulated signal with a signal whose frequency is close to that of the modulated signal to output a first pseudo baseband signal which has a frequency error with a baseband signal, an automatic frequency control circuit for producing a second pseudo baseband signal by minimizing the frequency error of the first pseudo baseband signal and a coherent demodulator for multiplying the second pseudo baseband signal with a carrier reproduced by a PLL type carrier reproduction circuit to produce the baseband signal.

The automatic frequency control circuit includes a PLL type demodulator whose bandwidth is larger than that of the coherent demodulator.

The wide band PLL type demodulator includes a first voltage controlled oscillator, a first multiplier for multiplying the first pseudo baseband signal with an output of the first voltage controlled oscillator, a first phase detector for producing a phase error signal from an output signal of the first complex multiplier and a first loop filter responsive to the phase error signal for controlling the first voltage controlled oscillator.

A loop noise bandwidth of the first loop filter is larger than that of a second loop filter included in the PLL type carrier reproduction circuit in the coherent demodulator.

The automatic frequency control circuit includes the wide band PLL type demodulator, a second voltage controlled oscillator, a low-pass filter for removing noise component of an output signal of the first loop filter and controlling the second voltage controlled oscillator, and a second multiplier for multiplying the first pseudo baseband signal with an output signal of the second voltage controlled oscillator to produce the second pseudo baseband signal.

The non-coherent demodulator multiplies a modulated IF signal with a signal whose frequency is close to that of the IF signal and outputs a complex baseband signal containing frequency error, $\exp[j(\omega(t)t+\Psi(t))]$, where $\omega(t)$ is error frequency, $\Psi(t)=\pi b(t)=0$ or $\pi$, $b(t)$ is a baseband signal. The complex baseband signal containing frequency error is referred to as first pseudo baseband signal.

Variation of frequency error is slow enough compared with pull-in operating of the wide band PLL type demodulator, so that an output of the loop filter in normal condition is $-\omega(t)$ and the output of the first voltage controlled oscillator is $\exp[-j\omega(t)t]$.

In order to make the loop filter responsive to a large frequency variation, loop noise bandwidth of this loop filter is set to a value much larger than that of a conventional loop filter. Therefore, output noise of the loop filter increases. However, since such noise component is compressed by the low-pass filter connected to an output of the loop filter, the effect of noise can be minimized. Assuming the output of the low pass filter is $-\omega'(t)$, the output of the second voltage controlled oscillator becomes $\exp[-j\omega'(t)t]$. By multiplying the output of the second voltage controlled oscillator with the complex baseband signal containing frequency error by means of the second complex multiplier, the output of the latter which is the second pseudo baseband signal becomes $$\exp[-j(\Delta\omega(t)t+\Psi(t))]$$

where $\Delta\omega(t)=\omega'(t)-\omega(t)$.

The output $\omega'(t)$ is close to $\omega(t)$. The reason is that low frequency component of $\omega'(t)$ is the same with that of $\omega(t)$ since $\omega'(t)$ is an output of the LPF to which $\omega(t)$ is inputted. Consequently, $\Delta\omega(t)$ becomes much smaller than $\omega(t)$.

Since it is possible to make $\Delta\omega(t)$ very small in this manner, a complex baseband signal, whose frequency error is minimized by absorbing frequency variation, is obtained at the output terminal of the second complex multiplier as the second pseudo baseband signal. By supplying this second pseudo baseband signal to the subsequent coherent demodulator which is a narrow band demodulator, the insensitivity to noise can be maintained. In order to remove effect of delay in the low pass filter, the complex baseband signal containing frequency error is passed through a delay circuit having delay equal to that of the low-pass filter and an output of the delay circuit is multiplied with the output of the second voltage controlled oscillator.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENTS

In order to facilitate understanding of the present invention, a conventional demodulating device will be described first.

Figure 1:
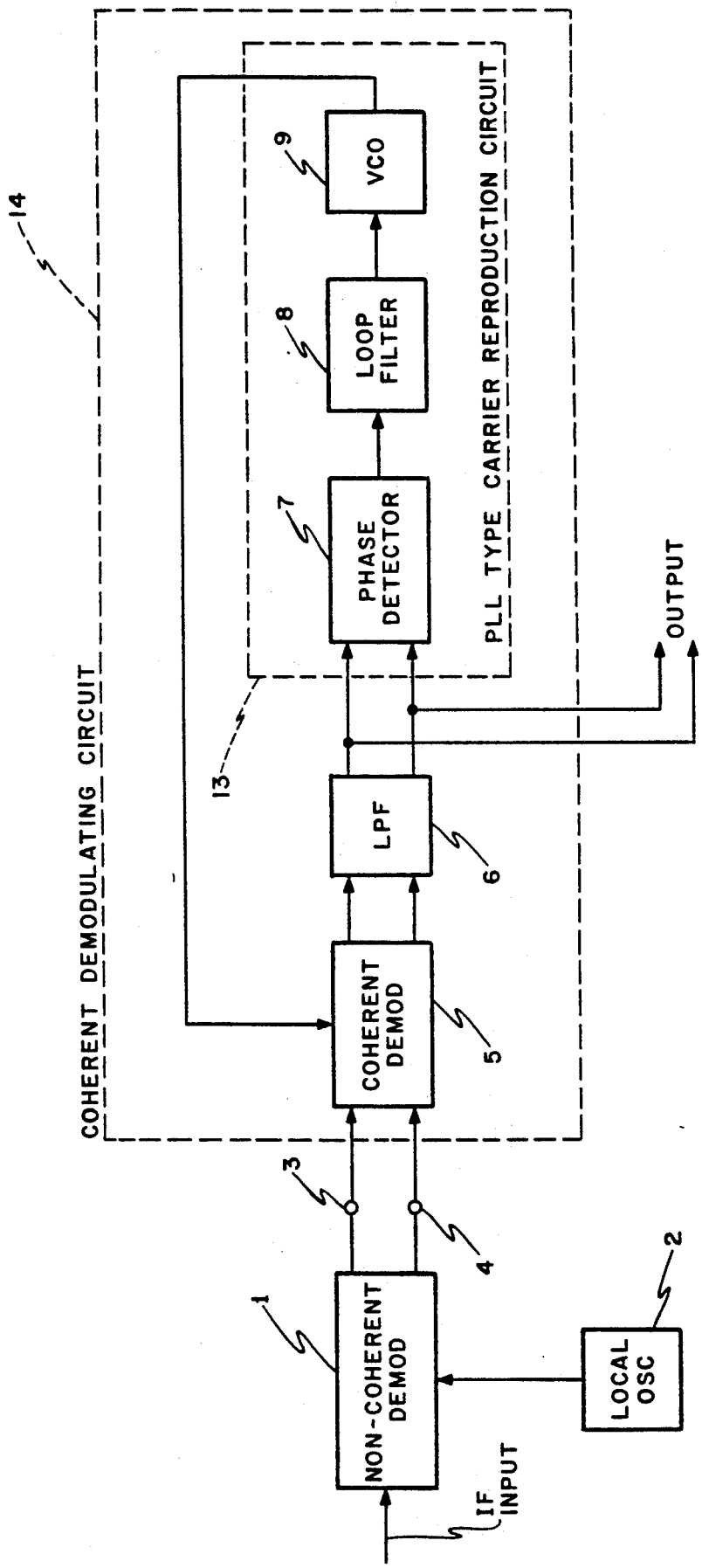
FIG. 1 is a block diagram of a conventional demodulator.

In FIG. 1 which is a block circuit diagram of the conventional demodulator, a non-coherent demodulator 1 serves to multiply a modulated IF signal with a signal from a local oscillator 2 oscillating at a frequency which is close to the IF signal frequency and output a complex baseband signal containing frequency error as a pseudo baseband signal. The term "non-coherent" used in this specification means that the received IF signal is not yet synchronized in frequency or phase, with the output signal of the local oscillator 2. Therefore, the output signal of the non-coherent demodulator 1 contains frequency error and, therefore, is referred to as pseudo baseband signal. Although the non-coherent demodulator 1 is not shown in detail, it branches the input IF signal and multiplies one of the branched two IF signals with the signal from the local oscillator 2 and multiplies the other with a signal obtained by phase-shifting the output signal of the local oscillator 2 by 90°. Each of resultant two products includes a real part and an imaginary part.

A coherent demodulator 5 receives the pseudo baseband signal from the non-coherent demodulator 1 through terminals 3 and 4 and a carrier signal reproduced by a voltage-controlled oscillator (VCO) 9. Although not shown, the coherent demodulator 5 multiplies the pseudo baseband signal from the terminal 3 with the reproduced carrier to produce one baseband signal and multiplies the other pseudo baseband signal from the terminal 4 with the reproduced carrier shifted in phase by 90° to produce the other baseband signal. That is, since the pseudo baseband signals are synchronized in phase with the reproduced carrier, the baseband signals are obtained.

A PLL type carrier reproduction circuit 13 is constituted with a phase detector 7, a loop filter 8 and the VCO 9. The phase detector 7 is of COSTAS type described in the aforementioned article "Phaselock Techniques" and receives the real part and the imaginary part of the baseband signal from the coherent demodulator 5 through two filtering portions of a low-pass filter (LPF) 6, respectively. The VCO 9 receives the phase error signal from the phase detector 7 through the loop filter 8 and reproduces the carrier.

An example of the modulated signal is a signal which is quadrature phase-shift keying (QPSK) signal. Assuming frequency band thereof is L band (1-2 GHz) and symbol rate of the modulated signal is fs, a loop noise bandwidth of the loop filter 8 is as narrow as fs/50.

When such demodulating device is used in a communication system such as mobile communication system in which variation of receiving signal frequency is considerably large and may go out of a pull-in range of the PLL type carrier reproduction circuit, the reproduced carrier is frequently slipped out, making it impossible to correctly receive the modulated signal. When the loop noise bandwidth of the loop filter 8 is expanded to solve the problem, its insensitivity to noise is degraded, as mentioned previously.

Figure 2:
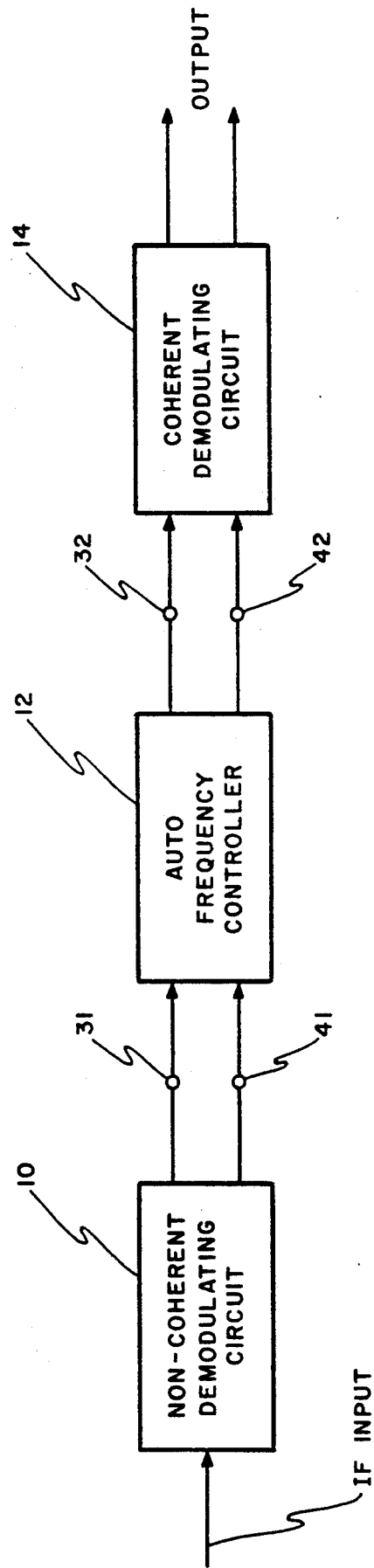
FIG. 2 is a block diagram of an embodiment of the present invention.

FIG. 2 is a block diagram of a demodulating device according to an embodiment of the present invention.

In FIG. 2, a non-coherent demodulator 10 having output terminals 31 and 41 includes the non-coherent demodulator 1 and the local oscillator 2 which are shown in FIG. 1, respectively. A coherent demodulator 14 is composed of the coherent demodulator 5, the low-pass filter (LPF) 6, the phase detector 7, the loop filter 8 and the VCO 9 which are those shown in FIG. 1, respectively. Operations of these components 1, 2, 5–9 are the same as those described with reference to FIG. 1, respectively, and the output terminals 31 and 41 of the non-coherent demodulator 10 correspond to the output terminals 3 and 4 of the non-coherent demodulator 1 shown in FIG. 1. Therefore, details thereof are omitted.

This embodiment of the present invention features an automatic frequency controller 12 provided between the non-coherent demodulator 10 and the coherent demodulator 14. The automatic frequency controller 12 serves to produce a pseudo baseband signal whose frequency error is small, by absorbing large frequency variation of receiving signaL.

Figure 3:
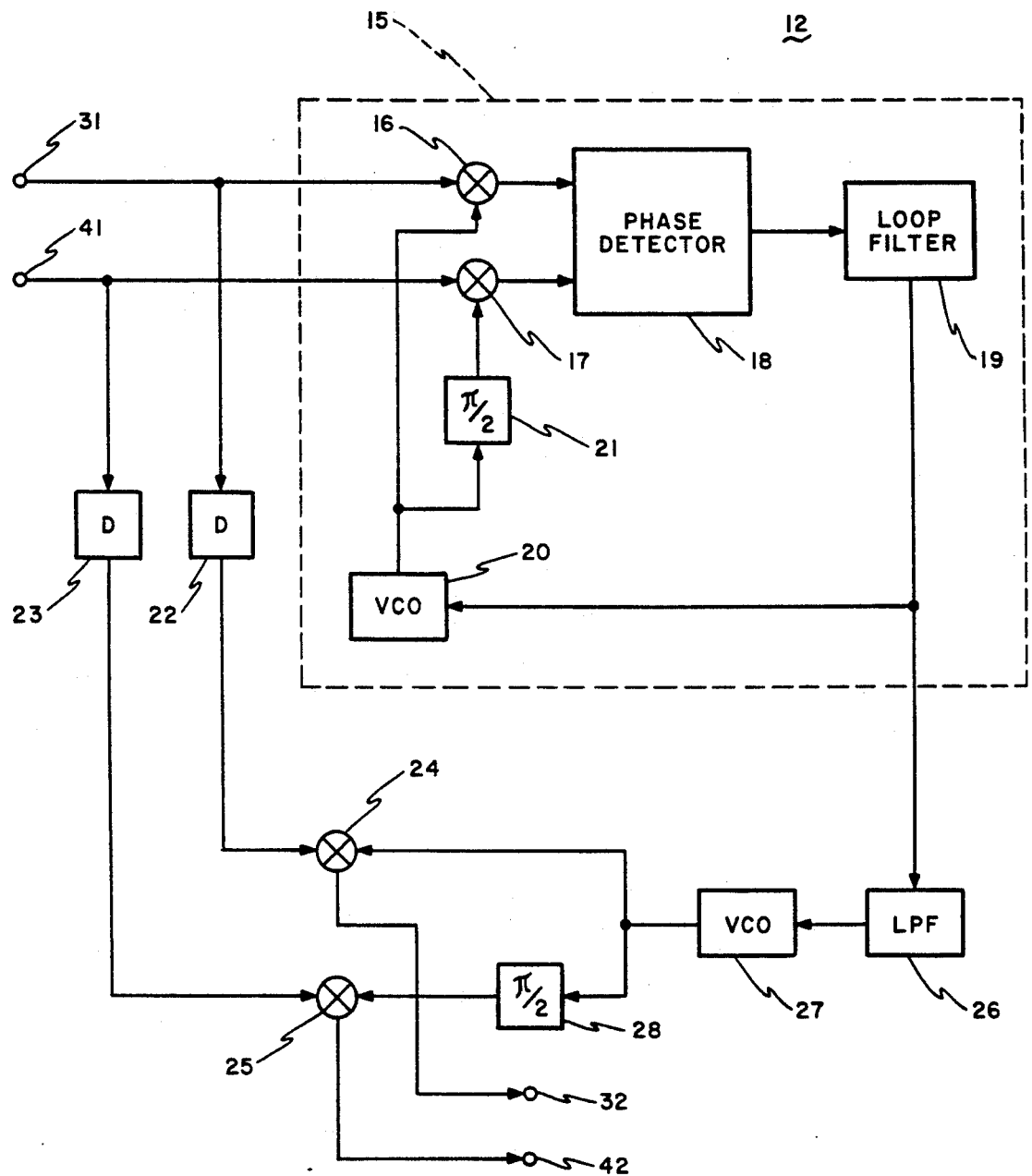
FIG. 3 is a block diagram of an auto frequency controller shown in FIG. 2, according to the present invention.

FIG. 3 shows the automatic frequency controller 12 shown in FIG. 2 in more detail.

In FIG. 3, a first pseudo baseband signal $\exp[j(\omega(t)t+\phi(t))]$ from the non-coherent demodulator 10, which is a complex baseband signal containing frequency error $\omega(t)$, is supplied through the terminals 31 and 41 to a wide band PLL type demodulator 15. The wide band PLL type demodulator 15 is composed of a first complex multiplier including multipliers 16 and 17 and a $\pi/2$ phase-shifter 21, a phase detector 18, a loop filter 19 and a first VCO 20.

The multiplier 16 multiplies the first pseudo baseband signal from the terminal 31 with a signal $\exp[-j\omega(t)t]$ from the first VCO 20. The multiplier 17 multiplies the other first pseudo baseband signal from the terminal 41 with the signal from the first VCO 20 phase-shifted by 90° by the $\pi/2$ phase-shifter 21. The phase detector 18 is of costas type and detects phase error between the output signals of the multipliers 16 and 17. The loop noise bandwidth of the loop filter 19 is set as wide as fs/5 and the first voltage-controlled oscillator 20 is controlled by the output signal $-\omega(t)$ of this loop filter 19.

Although this construction is responsible to a receiving signal having large frequency variation, noise may be increased since the loop noise bandwidth of the loop filter 18 is very large. In order to solve this noise problem, the output signal of the loop filter 19 is passed through a second LPF 26 to restrict noise component thereof. A second VCO 27 is controlled by the output $-\omega'(t)$ of the LPF 26. A pass-band of the low-pass filter 26 is preferably fs/200 although other pass band is also usable.

The first pseudo baseband signals $\exp[j(\omega(t)t+\phi(t))]$ from the terminals 31 and 41 supplied to the wide band PLL type demodulator 15 are also supplied to a second complex multiplier composed of multipliers 24 and 25 and a $\pi/2$ phase shifter 28. The multiplier 24 multiplies the first pseudo baseband signal from the terminal 31 with the signal $\exp[-j\omega'(t)t]$ from the second VCO 27 and a resultant second pseudo baseband signal is supplied to a terminal 32. The multiplier 25 multiplies the first pseudo baseband signal from the terminal 41 with the signal from the second voltage-controlled oscillator 27 which is phase-shifted by 90° by the $\pi/2$ phase-shifter 28 and a resultant second pseudo baseband signal is provided at a terminal 42.

The second pseudo baseband signals become $$\exp[-j(\Delta\omega(t)t+\phi(t))]$$

where $\Delta\omega(t)=\omega'(t)-\omega(t)$.

Since it is possible to make $\Delta\omega(t)$ very small, complex baseband signals whose frequency error is minimized are obtained.

In order to remove the effect of delay in the low-pass filter 26, it may be possible to provide delay circuits (D) 22 and 23 between the terminals 31 and 41 and the multipliers 24 and 25, respectively.

In FIG. 2, the second pseudo baseband signals from the terminals 32 and 42 having smaller frequency errors are supplied to the coherent demodulator 14 which is a narrow band demodulator.

As described hereinbefore, in the present invention, a first control signal for controlling the first VCO is produced by the wide band PLL type demodulator and the second VCO is controlled by a second control signal obtained by removing noise component of the first control signal. Then, the complex baseband signal whose frequency error is small is produced by multiplying the complex baseband signal containing frequency error with the output signal of the second VCO and the complex baseband signal having small frequency error is supplied to the narrow band demodulator.

Therefore, it is possible to assure a proper demodulating operation with respect to a receiving signal whose carrier frequency variation is considerable.

Although the present invention has been described with reference to the specific embodiments, this description is not meant to be construed in a limiting sense. Various modifications of the disclosed embodiments, as well as other embodiments of the present invention, will become apparent to persons skilled in the art upon reference to the description of the present invention. It is, therefore, contemplated that the appended claims will cover any modifications or embodiments as fall within the true scope of the present invention.

What is claimed is:

1. A demodulating device comprising:
non-coherent demodulating means for multiplying a modulated signal with a local frequency signal having frequency close to a frequency of the modulated signal to produce a first pseudo baseband signal having frequency error;
automatic frequency control means for reducing the frequency error of the first pseudo baseband signal to produce a second pseudo baseband signal; and
coherent demodulating means for multiplying the second pseudo baseband signal with a reproduced carrier to produce a baseband signal.

2. The demodulating device claimed in claim 1, wherein said automatic frequency control means comprises:
first oscillator means;
first multiplying means for multiplying the first pseudo baseband signal with an output signal of said first oscillator means;
first phase detecting means for producing a first phase error signal from an output of said first multiplying means;
a first loop filter for producing a first control signal from the first phase error signal for controlling said first oscillator means;
filtering means for removing noise component of the first control signal to produce a second control signal;
second oscillation means adapted to be controlled by the second control signal; and
second multiplying means for multiplying the first pseudo baseband signal with an output of said second oscillation means to produce the second pseudo baseband signal.

3. The demodulating device claimed in claim 2, wherein said filtering means comprises a low pass filter.

4. The demodulating device claimed in claim 2, wherein said coherent demodulating means comprises:
third oscillation means;
coherent demodulator for multiplying the second pseudo baseband signal with said reproduced carrier from said third oscillation means to produce the baseband signal;
second phase detecting means for producing a second phase error signal from the baseband signal; and
a second loop filter for outputting a third control signal from the second phase error signal for controlling said third oscillation means.

5. The demodulating device claimed in claim 4, wherein loop noise bandwidth of said first loop filter is wider than that of said second loop filter.

6. A demodulating device comprising:
non-coherent demodulating means for performing orthogonal detection of a received modulated signal with a signal having frequency close to a frequency of the modulated signal to produce first pseudo baseband signals having frequency error;
automatic frequency control means responsive to the first pseudo baseband signals to produce second pseudo baseband signals having smaller frequency error; and
narrow band coherent demodulating means for performing orthogonal detection of the second pseudo baseband signals with a reproduced carrier to produce baseband signals.

7. The demodulating device claimed in claim 6, wherein said automatic frequency control means comprises:
first oscillator means;
first multiplying means for multiplying the first pseudo baseband signals with an output signal of said first oscillator means;

phase detecting means for producing a first phase error signal from an output of said first multiplying means;

a loop filter for producing a first control signal from the first phase error signal for controlling said first oscillator means;

filtering means for removing noise component of the first control signal to produce a second control signal;

second oscillation means adapted to be controlled by the second control signal; and second multiplying means for multiplying the first pseudo baseband signals with an output of said second oscillation means to produce the second pseudo baseband signals.

8. The demodulating device claimed in claim 7, wherein said filtering means comprises a low pass filter.

9. The demodulating device claimed in claim 2 or 7, wherein the first pseudo baseband signal is supplied to said second multiplying means through delay means.

10. An automatic frequency controller for receiving a first pseudo baseband signal having frequency error obtained by orthogonally detecting a received modulated signal with a signal having frequency close to a frequency of the modulated signal and outputting a second pseudo baseband signal having smaller frequency error to a narrow band coherent demodulator, said automatic frequency controller comprising:

first oscillator means;

first multiplying means for multiplying the first pseudo baseband signal with an output signal of said first oscillator means;

phase detecting means for producing a first phase error signal from an output of said first multiplying means;

a loop filter having wider band width than said coherent demodulating means, for producing a first control signal from the first phase error signal for controlling said first oscillator means;

filtering means for removing noise component of the first control signal to produce a second control signal;

second oscillation means adapted to be controlled by the second control signal; and second multiplying means for multiplying the first pseudo baseband signal with an output of said second oscillation means to produce the second pseudo baseband signal.

* * * * *